(12) United States Patent
Srivastava et al.

(10) Patent No.: US 7,609,090 B2
(45) Date of Patent: Oct. 27, 2009

(54) HIGH SPEED LEVEL SHIFTER

(75) Inventors: Ankit Srivastava, Uttar Pradesh (IN); Sourav Jandial, Jammu Cantt (IN)

(73) Assignee: STMicroelectronics Pvt. Ltd., Greater Noida, Uttar Pradesh (UP) (IN)

(*) Notice: Subject to any disclaimer, the term of this patent is extended or adjusted under 35 U.S.C. 154(b) by 0 days.

(21) Appl. No.: 11/895,643

(22) Filed: Aug. 23, 2007

(65) Prior Publication Data

US 2008/0074148 A1    Mar. 27, 2008

(30) Foreign Application Priority Data

Aug. 23, 2006   (IN) .................... 1897/DEL/2006

(51) Int. Cl.
*H03K 19/0175* (2006.01)
(52) U.S. Cl. ............................. 326/80; 326/68; 327/333
(58) Field of Classification Search ............ 326/62–63, 326/68, 80–83; 327/333
See application file for complete search history.

(56) References Cited

U.S. PATENT DOCUMENTS

| | | | | |
|---|---|---|---|---|
| 5,510,731 A | * | 4/1996 | Dingwall | 326/63 |
| 5,995,010 A | * | 11/1999 | Blake et al. | 340/653 |
| 6,005,413 A | * | 12/1999 | Schmitt | 326/80 |
| 6,487,687 B1 | * | 11/2002 | Blake et al. | 714/724 |
| 6,700,429 B2 | * | 3/2004 | Kanno et al. | 327/333 |
| 6,864,718 B2 | * | 3/2005 | Yu | 326/68 |
| 6,963,226 B2 | | 11/2005 | Chiang | |
| 7,071,730 B2 | * | 7/2006 | Cordoba | 326/38 |
| 7,200,053 B2 | * | 4/2007 | Kim et al. | 365/189.11 |
| 7,310,012 B2 | * | 12/2007 | Chen | 327/333 |

* cited by examiner

*Primary Examiner*—James H. Cho
*Assistant Examiner*—Christopher Lo
(74) *Attorney, Agent, or Firm*—Lisa K. Jorgenson; Paul F. Rusyn; Graybeal Jackson LLP

(57) ABSTRACT

Embodiments of the present invention provide level shifter circuits capable of high frequency operations. The level shifter circuit utilizes a dynamic charge injection device, which diminishes a capacitive coupling effect between a gate and a drain of input NMOS devices, when the input signal switches from a high logic level to a low logic level. The dynamic charge injection device is incorporated at output nodes to provide initial thrust to the level shifter circuits, which triggers a positive regenerative feedback of cross-coupled pull up PMOS devices enabling a rapid transition and hence the high frequency operation.

5 Claims, 12 Drawing Sheets

US 7,609,090 B2

HIGH SPEED LEVEL SHIFTER

PRIORITY CLAIM

This application claims priority from Indian patent application No. 1897/Del/2006, filed Aug. 23, 2006, which is incorporated herein by reference.

TECHNICAL FIELD

Embodiments of the present invention relate to semiconductor devices and more specifically to level shifters, which are an integral part of integrated circuits with more than one power supply levels.

BACKGROUND

Input/Output (I/O) circuits normally operate at a higher voltage level than the core of the integrated circuit (IC). A higher supply level at the I/O pads is desirable to drive huge loads at an optimum speed. A lower supply level at the core enables the use of smaller gate oxide transistors and reduces the power consumption.

FIG. 1 illustrates a conventional level shifter circuit, which receives an input signal at a lower voltage level (VDD) and generates an output signal at a higher voltage level (VDDE). The circuit has two P-channel transistors P1, P2; two N-channel transistors N1, N2 and a standard inverter INV. The transistor P1 is coupled between the VDDE and an OUTA node, its gate is coupled to an OUTB node. The transistor P2 is coupled between the VDDE and the node OUTB, its gate coupled to the OUTA node. The transistor N1 is coupled between the node OUTA and ground GNDE with its gate coupled to the low voltage input signal in. The transistor N2 is coupled between nodes the OUTB and the GNDE, with its gate coupled to receive the signal inn. The signal inn is generated by a low voltage inverting device INV.

The transistors N1, N2, P1, and P2 are typically manufactured using a thicker gate oxide than the transistors comprising the inverting device INV. This thicker oxide enables these to sustain the higher voltage supply (VDDE), while the thinner oxide for INV transistors is enough to sustain the lower voltage supply (VDD).

The circuit of FIG. 1 operates as follows. When the input signal in is at a logic low level (0 Volts), the transistor N1 is off and the transistor N2 is on (because the signal inn is at high logic level (VDD) due to the inverting device INV). As a consequence, the node OUTB is low (0 volts). Thus the P1 is on and the node OUTA is high (VDDE volts). When the input signal in is high (VDD volts), the transistor N1 is on and transistor N2 is off (because the signal inn is low due to the inverting device). Thus the node OUTA is low and the transistor P2 is on due to which the OUTB is high (VDDE volts).

As far as the steady state operation is concerned, the above circuit does not involve any undesirable current consumption as all the voltage levels are well defined. However, when the input signal transits from low to high logic level undesirable current consumption can occur. For instance, let us consider the case when the input signal in rises from a low level to a high level (VDD). When the signal in is low, the nodes OUTA and OUTB are high (VDDE) and low respectively. As the signal in rises above the threshold voltage of the transistor N1, it turns on, thereby trying to pull down the node OUTA. But at this point in time, the transistor P1 is also on. Thus a contention appears between transistors N1 and P1 due to which the node OUTA falls slowly. Eventually, the node OUTA falls sufficiently low to turn on the transistor P2. At this point in time, both transistor N2 and transistor P2 are on and a contention appears between the two due to which the node OUTB rises slowly. As the signal inn goes low, the transistor N2 turns off, thus allowing the transistor P2 to pull up the node OUTB. At some point the node OUTB rises high enough to turn off the transistor P1, thus allowing the transistor N1 to pull down the node OUTA to the GNDE. At this point, the transistor P2 turns fully on and the node OUTB rises to VDDE.

The transistors N1 and N2 have thick gate oxide and hence a higher threshold voltage. Thus if the input signal in is rising, the transistor N1 would turn on later, thus delaying the transitions at nodes OUTA and OUTB. Moreover, if the threshold voltage of N1 is comparable to the lower supply voltage VDD, then the transistor N1 may not get on strongly enough to pull down the node OUTA quickly. Thus, the contention between the transistor N1 and the transistor P1 takes a long time to get resolved, thereby slowing the transition at nodes OUTA and OUTB and consuming a large crowbar current.

FIG. 2 illustrates one approach to solve the above situation arising due to a higher threshold voltage of thicker oxide transistors N1 and N2. This circuit is similar to the circuit of FIG. 1 except that two thick N-channel transistors N7 and N8 are added and the thick gate oxide transistors N1 and N2 are replaced by thin gate oxide transistors for sustaining the low voltage level (VDD). The transistor N7 is added between the transistor N1 and the node OUTA and the transistor N8 is added between the transistor N2 and the node OUTB. The gates of both transistors N7 and N8 are coupled to a reference signal VREF. Both the transistors N7 and N8 are thick gate oxide transistors, which can sustain a higher supply level (VDDE). The VREF is a reference voltage signal, which ensures that transistors N1 and N2 are not stressed by the higher supply VDDE. This VREF signal is generally of the voltage level VDD plus a threshold voltage of thick gate oxide transistor.

As transistors N1 and N2 are thin gate oxide transistors, they have a lower threshold voltage. Thus, if the input signal in is rising, the transistor N1 would get on early, thus causing node A and hence the node OUTA to fall faster. This turns on the transistor P2 which pulls up the node OUTB to turn off the transistor P2, thus activating regenerative feedback and causing rapid transitions at nodes OUTA and OUTB.

There is an inherent drawback in both circuits of FIG. 1 and FIG. 2. To understand this, consider the input signal in switching from a high to low in FIG. 1. Initially when the signal in is high (VDD), the node OUTA is at the ground voltage GNDE and the node OUTB is at higher supply level VDDE. Now as the signal in starts falling, the node OUTA tends to follow due to capacitive coupling between the gate and drain of transistor N1. This causes node OUTA to fall below ground voltage GNDE, thus increasing the overdrive voltage of the transistor P2 and turning it on more strongly. As the signal inn at the gate of the transistor N2 is going high, there is a stronger contention between transistors N2 and P2. As a consequence, the node OUTB falls slowly. Thus the transistor P1 turns on slowly due to, which the node OUTA rises slowly. This further turns off the transistor P2 slowly and hence the fall time at the node OUTB increases. Thus the rise and fall times at nodes OUTA and OUTB increase, thereby making it difficult to operate the circuits of FIG. 1 and FIG. 2 at high frequencies.

A crowbar current is also an important consideration while designing level shifter circuits. It is particularly significant in level shifter circuits which are used to drive heavily loaded I/O pads. When many output signals switch state simultaneously, the crowbar currents of many level shifters get added up to yield an appreciable value for this overall current.

Thus there is a need of a novel level shifter circuit with rapid transitions at the output nodes, hence making high frequency operations possible while consuming a lower crowbar current.

SUMMARY

According to embodiments of the present invention, a level shifter circuit leads to fast rise/fall transitions at the output nodes and allows a circuit to function at higher frequencies with improved performance.

According to embodiments of the present invention, level shifter circuits operate at higher frequencies while consuming lower crowbar current.

According to one embodiment of the present invention, a high speed level shifter circuit for high frequency operation includes:
- a first PMOS transistor having a source terminal connected to a high voltage supply, a drain terminal connected to a first output node, and a gate terminal connected to a second output node;
- a second PMOS transistor having a source terminal connected to the high voltage supply, a drain terminal connected to the second output node, and a gate terminal connected to the first output node;
- a first NMOS transistor having a drain terminal connected to the drain terminal of said first PMOS transistor through the first output node, a source terminal connected to a ground voltage and a gate terminal connected to a first input node for receiving a first input signal;
- a second NMOS transistor having a drain terminal connected to the drain terminal of said second PMOS transistor through the second output node, a source terminal connected to the ground voltage and a gate terminal connected to a second input node for receiving a second input signal, said second signal being an inverted signal of the first input signal;
- an inverter circuit operatively coupled between the gate terminal of first NMOS transistor and the gate terminal of the second NMOS transistor for inverting the first input signal to the second input signal;
- a first NMOS diode connected to the first output node for providing the second input signal; and
- a second NMOS diode connected to the second output node for providing the first input signal.

Another embodiment of the present invention provides a high speed level shifter circuit for a high frequency operation including:
- a first PMOS transistor having a source terminal connected to a high voltage supply, a drain terminal connected to a first output node, and a gate terminal connected to a second output node;
- a second PMOS transistor having a source terminal connected to the high voltage supply, a drain terminal connected to the second output node, and a gate terminal connected to the first output node;
- a first NMOS transistor having a drain terminal connected to the drain terminal of said first PMOS transistor through the first output node, a source terminal connected to a ground voltage and a gate terminal connected to a first input node for receiving a first input signal;
- a second NMOS transistor having a drain terminal connected to the drain terminal of said second PMOS transistor through the second output node, a source terminal connected to the ground voltage and a gate terminal connected to a second input node for receiving a second input signal, said second signal being an inverted signal of the first input signal;
- an inverter circuit operatively coupled between the gate terminal of first NMOS transistor and the gate terminal of the second NMOS transistor for inverting the first input signal to the second input signal;
- a third NMOS transistor having a source terminal connected to the first output node, a drain terminal connected to a first node and a gate terminal connected to the second output node;
- a third PMOS transistor having a source terminal connected to a low voltage supply, a drain terminal connected to the drain terminal of the third NMOS transistor through the first node and a gate terminal connected to the gate terminal of the first NMOS transistor through the first input node;
- a fourth NMOS transistor having a source terminal connected to the second output node, a drain terminal connected to a second node and a gate terminal connected to the first output node; and
- a fourth PMOS transistor having a source terminal connected to the low voltage supply, a drain terminal connected to the drain terminal of the fourth NMOS transistor through the second node and a gate terminal connected to the gate terminal of the second NMOS transistor through the second input node.

A further embodiment of the present invention provides a high speed level shifter circuit for a high frequency operation including:
- a first PMOS transistor having a source terminal connected to a high voltage supply, a drain terminal connected to a first output node, and a gate terminal connected to a second output node;
- a second PMOS transistor having a source connected to the high voltage supply, a drain connected to the second output node, and a gate terminal connected to the first output node;
- a first NMOS transistor having a drain terminal connected to the drain terminal of said first PMOS transistor through the first output node, a source terminal connected to a ground voltage and a gate terminal connected to a first input node for receiving a first input signal;
- a second NMOS transistor having a drain terminal connected to the drain terminal of said second PMOS transistor through the second output node, a source terminal connected to the ground voltage and a gate terminal connected to a second input node for receiving a second input signal, said second signal being an inverted signal of the first input signal;
- an inverter circuit operatively coupled between the gate terminal of first NMOS transistor and the gate terminal of the second NMOS transistor for inverting the first input signal to the second input signal;
- a third NMOS transistor having a source terminal connected to the first output node, a drain terminal connected to a first node and a gate terminal connected to a third node;
- a third PMOS transistor having a source terminal connected to a low voltage supply, a drain terminal connected to the drain terminal of the third NMOS transistor through the first node and a gate terminal connected to the gate terminal of the first NMOS transistor through the first input node;

a fourth NMOS transistor having a source terminal connected to the second output node, a drain terminal connected to a second node and a gate terminal connected to a fourth node;

a fourth PMOS transistor having a source terminal connected to the low voltage supply, a drain terminal connected to the drain terminal of the fourth NMOS transistor through the second node and a gate terminal connected to the gate terminal of the second NMOS transistor through the second input node;

a fifth NMOS transistor having a drain terminal connected the second output node, a source terminal connected to the gate terminal of the third NMOS transistor through the third node and a gate terminal connected to the high voltage supply; and a sixth NMOS transistor having a drain terminal connected the first output node, a source terminal connected to the gate terminal of the fourth NMOS transistor through the fourth node and a gate terminal connected to the high voltage supply.

A still further embodiment of the present invention provides a high speed level shifter circuit for a high frequency operation including:

a first PMOS transistor having a source terminal connected to a high voltage supply, a drain terminal connected to a first output node, and a gate terminal connected to a second output node;

a second PMOS transistor having a source terminal connected to the high voltage supply, a drain terminal connected to the second output node, and a gate terminal connected to the first output node;

a first NMOS transistor having a drain terminal connected to the first node, a source terminal connected to the ground voltage and a gate terminal connected to a first input node for, receiving a first input signal;

a second NMOS transistor having a drain terminal connected to the second node, a source terminal connected to the ground voltage and a gate terminal connected to a second input node for receiving a second input signal;

a third NMOS transistor having a drain terminal connected to the drain terminal of the first PMOS transistor through the first output node, a source terminal connected to the drain terminal of the first NMOS transistor through the first node and a gate terminal connected to a third node for receiving a reference signal;

a fourth NMOS transistor having a drain terminal connected to the drain terminal of the second PMOS transistor through the second output node, a source terminal connected to the drain terminal of the second NMOS transistor through the second node and a gate terminal connected to the gate terminal of the third NMOS transistor through the third node for receiving a reference signal;

an inverter circuit operatively coupled between the gate terminal of the first NMOS transistor and the gate terminal of the second NMOS transistor for inverting the first input signal to the second input signal;

a third PMOS transistor having a source terminal connected to a low voltage supply, a drain terminal connected to the first node and a gate terminal connected to the gate terminal of the first NMOS transistor through the first input node; and a fourth PMOS transistor having a source terminal connected to the low voltage supply, a drain terminal connected to the second node and a gate terminal connected to the gate terminal of the second NMOS transistor through the second input node.

According to another embodiment of the present invention a method of shifting a voltage level by diminishing a capacitive coupling effect in a high speed level shifter circuit for a high frequency operation includes the steps of:

switching of a first input signal alternately from a high logic level to a low logic level and a low logic level to a high logic level;

switching of a second input signal alternately from the low logic level to the high logic level and the high logic level to the low logic level;

turning on a dynamic charge injection device to inject current into a output node to nullify a capacitive coupling effect between a input node and the output node;

charging of the output node to initiate triggering of a regenerative feedback among cross coupled PMOS devices to get a voltage level shift with a high speed.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of the present invention provide high speed level shifter circuits for high frequency operation with improved regenerative feedback triggering.

Figure 11:
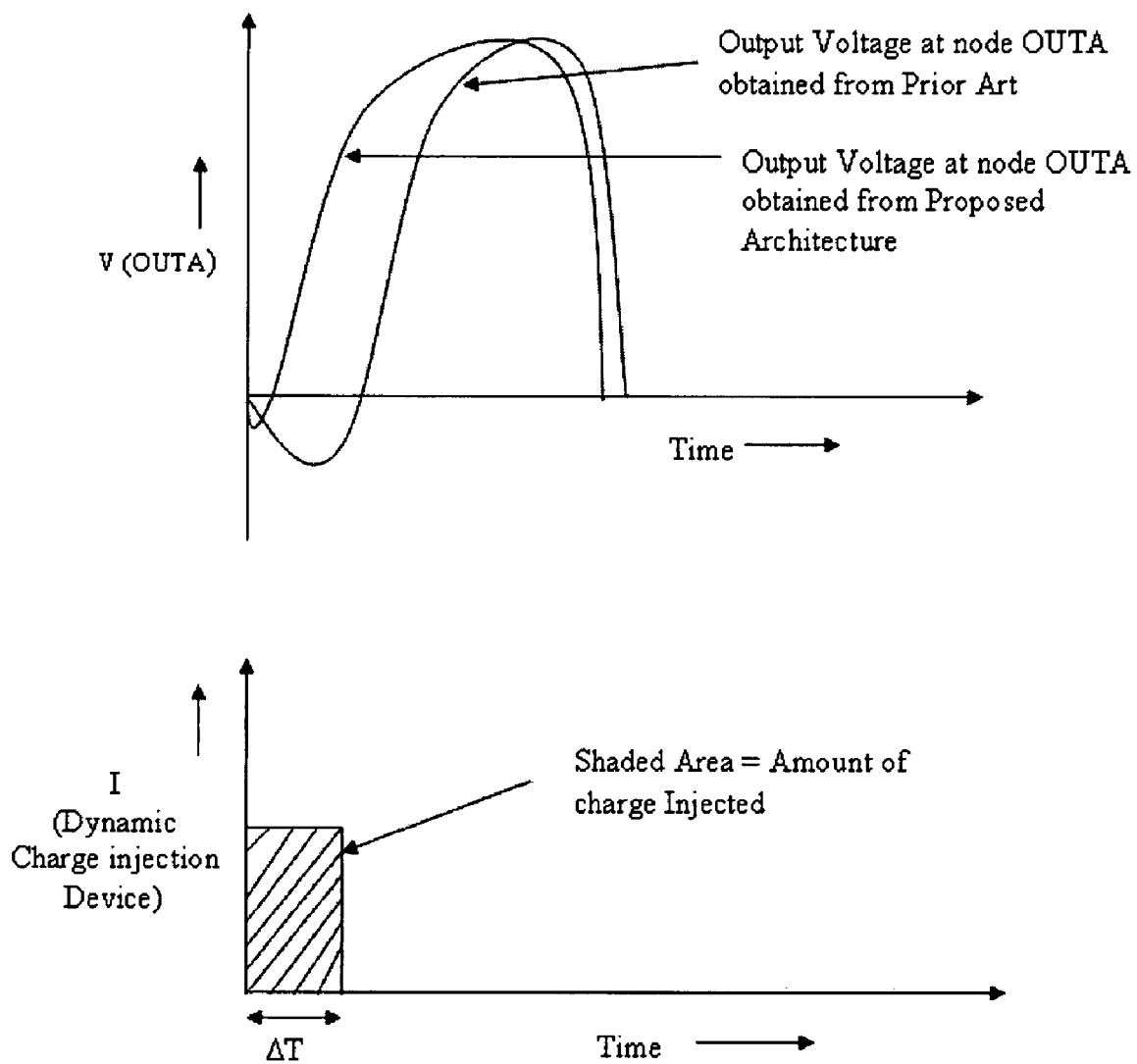
FIG. 11 illustrates a sample output waveform illustrating the dynamic charge injection concept utilized in the embodiments of FIGS. 3-11.
Figure 12:
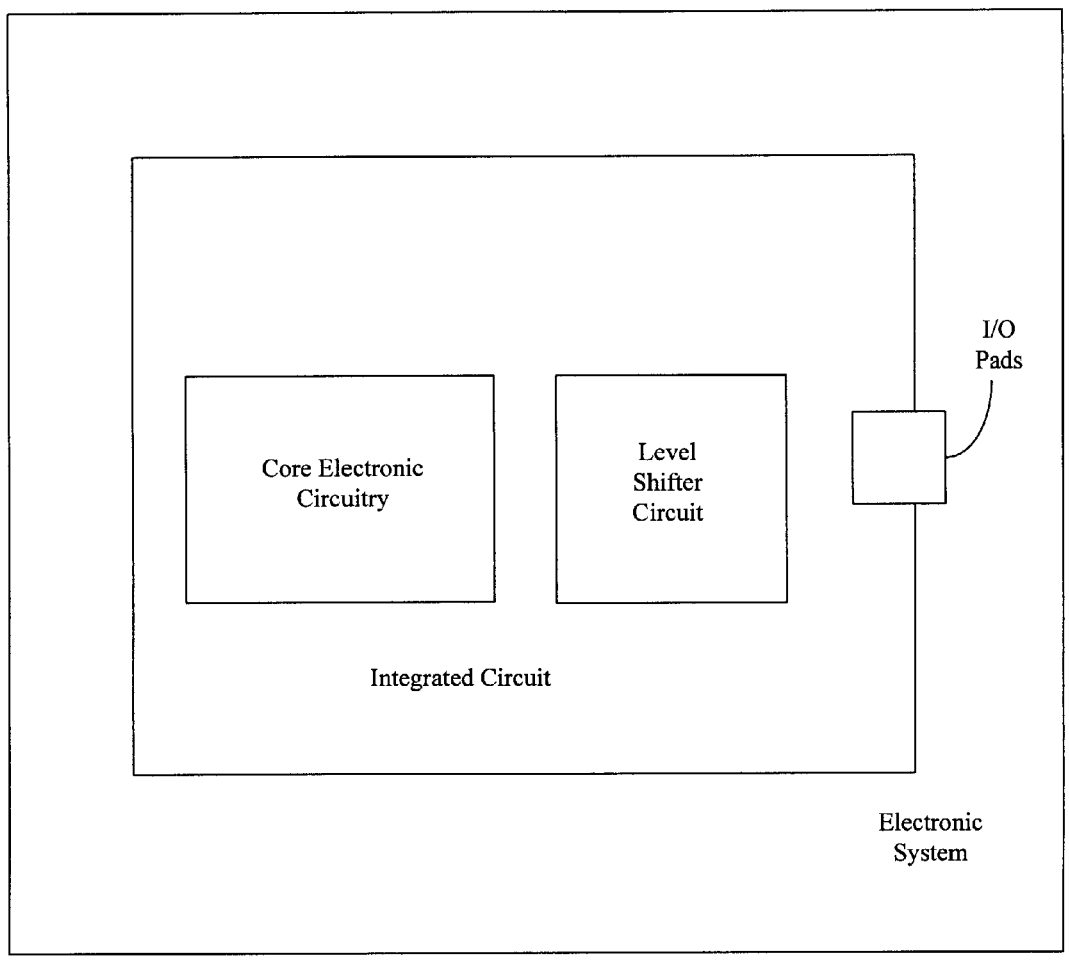
FIG. 12 is a functional block diagram of an electronic system including an integrated circuit which, in turn, includes a level shifter according to one or more of the embodiments of FIGS. 3-6.

Embodiments of the present invention present level shifter circuits that can operate at higher frequencies while consuming the lower crowbar currents. The basic principle employed is to use a dynamic charge injection device which injects charges at nodes OUTA or OUTB when input signal in or inn switches from high to low logic levels respectively. The dynamic charge injection device is connected to both ladders and is coupled to the drains of N-channel input devices (N1, N2) which receive a lower supply level VDD input signals in/inn. The purpose of the dynamic charge injection device is to inject charges into the drains of the input transistors (N1, N2) when the corresponding ladder input signal switches from a high to a low logic level. As illustrated in FIG. 11, this dynamic charge injection device injects charges only for a small period of a time ΔT, which is dependent on circuit specifications like a frequency of operation, an input signal slope, an output load capacitance and a gate-drain coupling capacitance of the input transistors (N1, N2). The dynamic charge injection device can be designed to achieve the desired ΔT. The embodiments which follow illustrate the above concept wherein the dynamic charge injection device is designed in different ways. However the idea is not just limited to these embodiments only. This dynamic charge injection device can be modified to incorporate digital codes serving various purposes like process, voltage and temperature compensation or digitally switching off the dynamic charge injection device after the desired time ΔT. The dynamic charge injection device can be implemented by using both thin gate oxide and thick gate oxide transistors.

Figure 1:
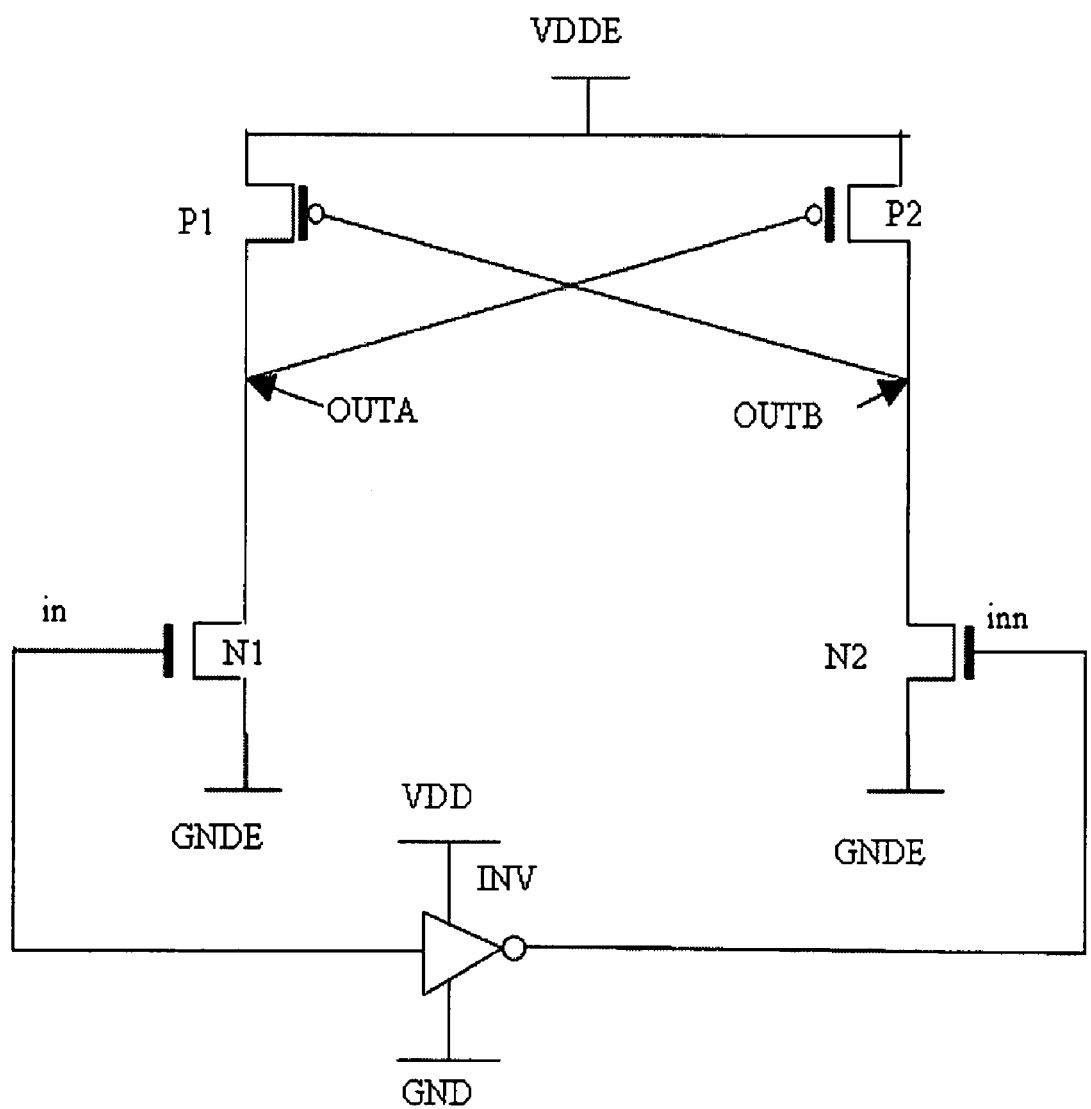
FIG. 1 illustrates a circuit diagram of a conventional level shifter.
Figure 2:
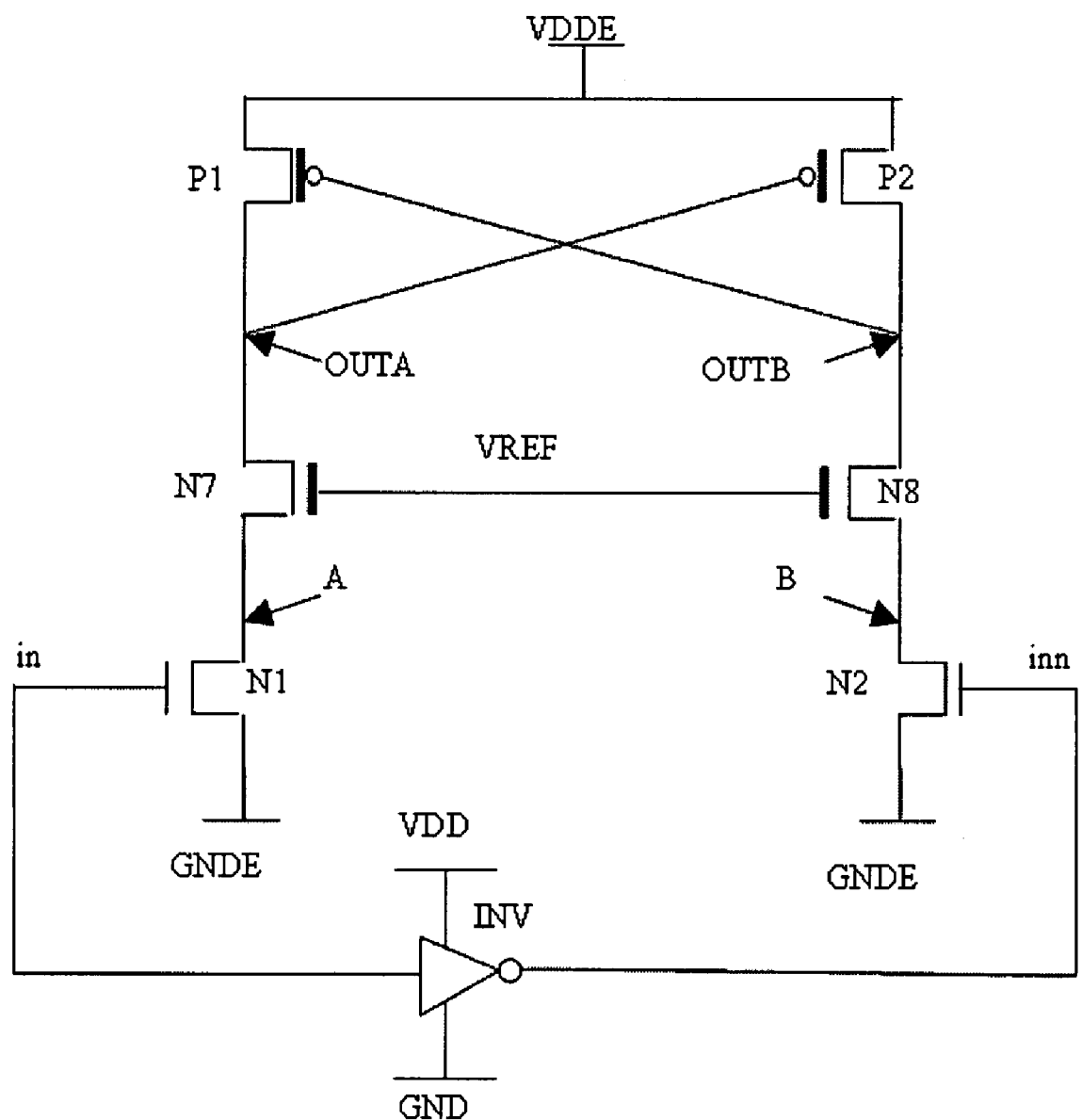
FIG. 2 illustrates a circuit diagram of another conventional level shifter employing low voltage transistors at the input.

The enhancement of the approach of FIG. 1 is illustrated and described using three different circuits for three different higher power supply levels, namely 1.8V, 2.5V, 3.3V. The lower supply level for all the three is 1.2V. The enhancement of the approach of FIG. 2 works for all supply levels.

Figure 3:
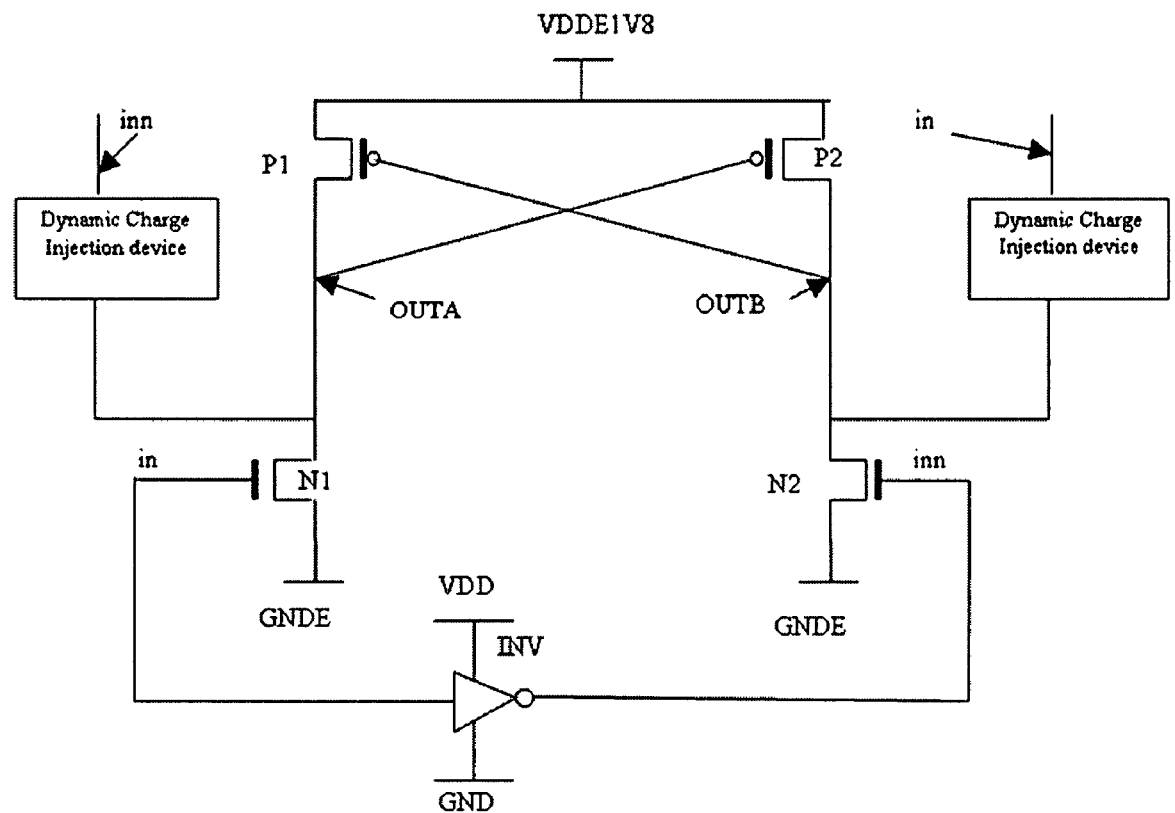
FIG. 3 illustrates a block diagram of an improvement of FIG. 1 operational at 1.8V high voltage supply range according to one embodiment of the present invention.

FIG. 3 illustrates a block level implementation of a new algorithm for operation at a higher supply level up to 1.98V according to one embodiment of the present invention. A dynamic charge injection device is coupled to an output node OUTA and an opposite ladder input signal inn is added or applied to the dynamic charge injection device. Another dynamic charge injection device is connected in a similar fashion to the opposite ladder. The dynamic charge injection device senses the opposite ladder input signal (inn/in) and sources current into the output node OUTA/OUTB for a small period of a time ΔT. This not only nullifies the effect of capacitive coupling between the input node (in/inn) and the output node (OUTA/OUTB), but also charges the output node OUTA/OUTB to initiate early triggering of the regenerative feedback among cross coupled PMOS devices.

Figure 4:
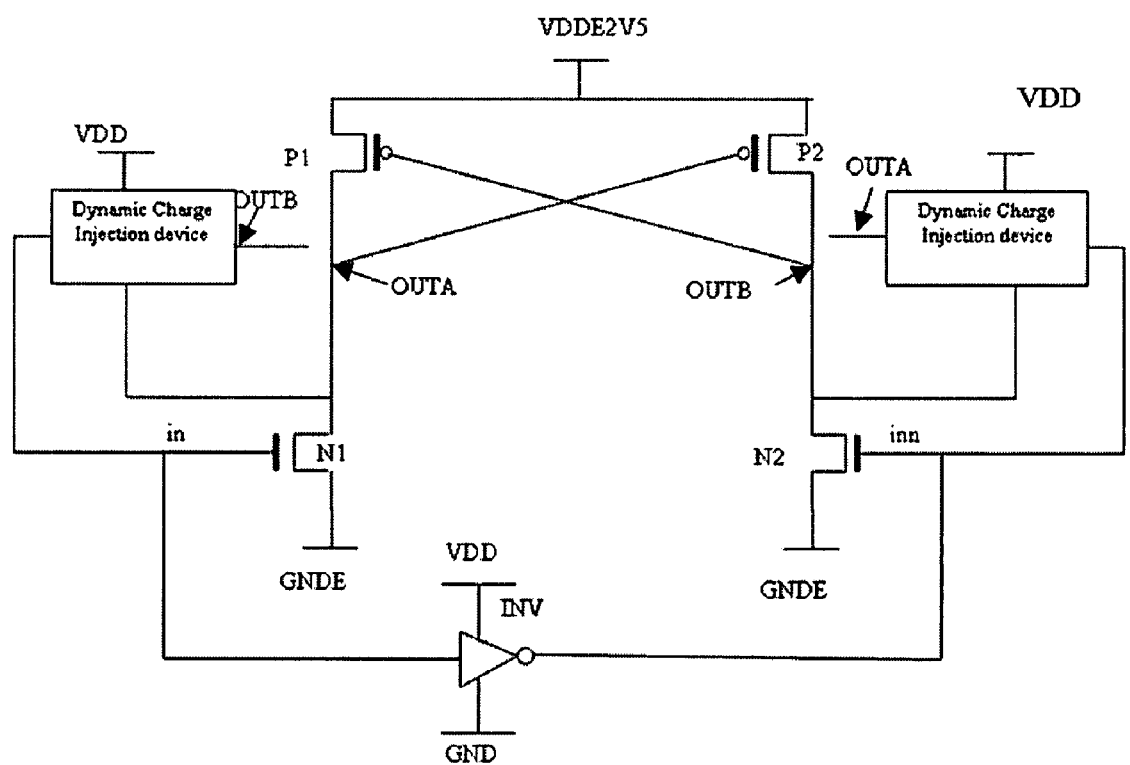
FIG. 4 illustrates a block diagram of an improvement of FIG. 1 operational at 2.5V high voltage supply range according to another embodiment of the present invention.

FIG. 4 illustrates a block level implementation of a new algorithm for operation at a higher supply level up to 2.7V according to another embodiment of the present invention. A dynamic charge injection device is coupled to a lower supply level node VDD, an input signal in, an output node OUTA, and an opposite ladder output node OUTB is added. Another dynamic charge injection device is connected in a similar fashion to the opposite ladder. Each dynamic charge injection device senses the input signal (in/inn) and the opposite ladder output node (OUTB/OUTA) and sources current into the output node (OUTA/OUTB) during an initial transition period and is turned off thereafter. This not only nullifies the effect of capacitive coupling between the input node (in/inn) and the output node (OUTA/OUTB), but also charges the output node OUTA/OUTB to initiate early triggering of the regenerative feedback among cross coupled PMOS devices.

Figure 5:
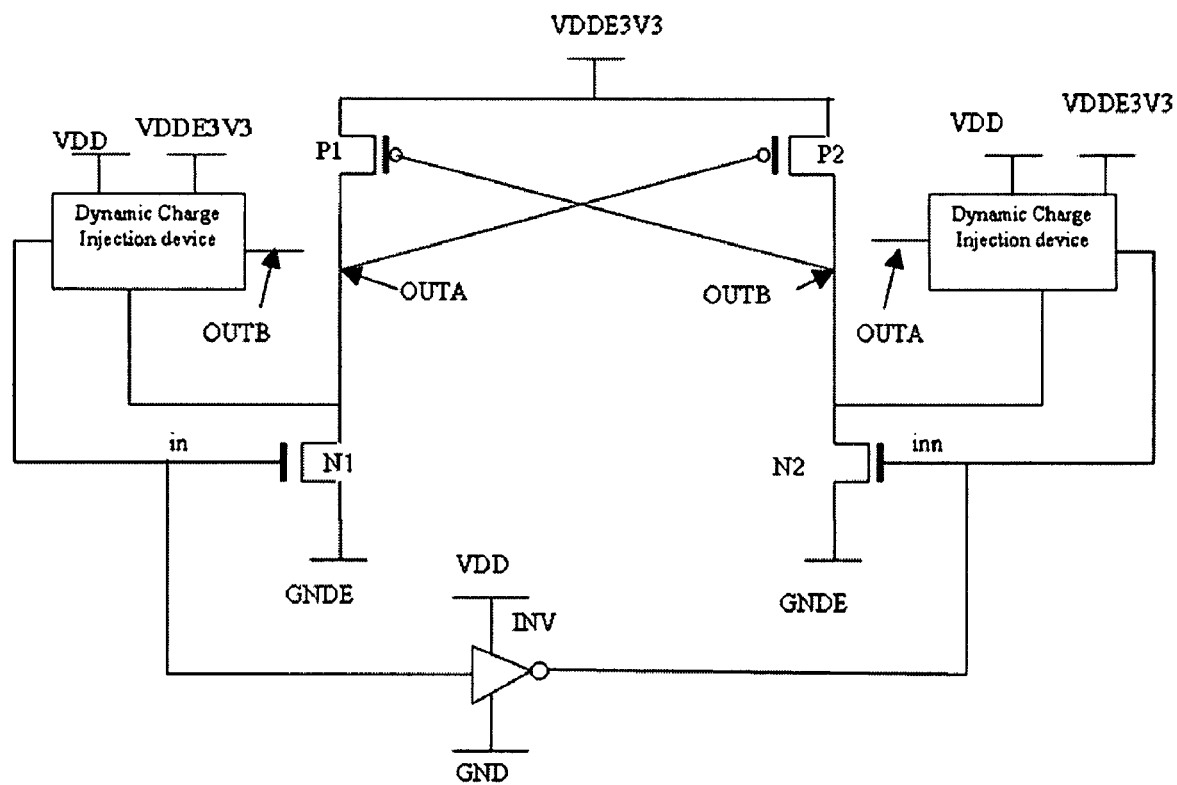
FIG. 5 illustrates a block diagram of an improvement of FIG. 1 operational at 3.3V high voltage supply range according to another embodiment of the present invention.

FIG. 5 illustrates a block level implementation of a new algorithm for operation at higher supply level up to 3.6 V according to another embodiment of the present invention. A dynamic charge injection device is coupled to a lower supply level node VDD, an opposite ladder output node (OUTB/OUTA), an output node (OUTA/OUTB) and a higher power supply node VDDE is added. Another dynamic charge injection device is connected in a similar fashion to the opposite ladder. Each dynamic charge injection device senses an input signal (in/inn), the opposite ladder output node (OUTB/OUTA) and the higher voltage level node VDDE and sources current into the output node (OUTA/OUTB) and is turned off thereafter. This not only nullifies the effect of capacitive coupling between the input node (in/inn) and the output node (OUTA/OUTB), but also charges the output node OUTA/OUTB to initiate early triggering of the regenerative feedback among cross coupled PMOS devices.

Figure 6:
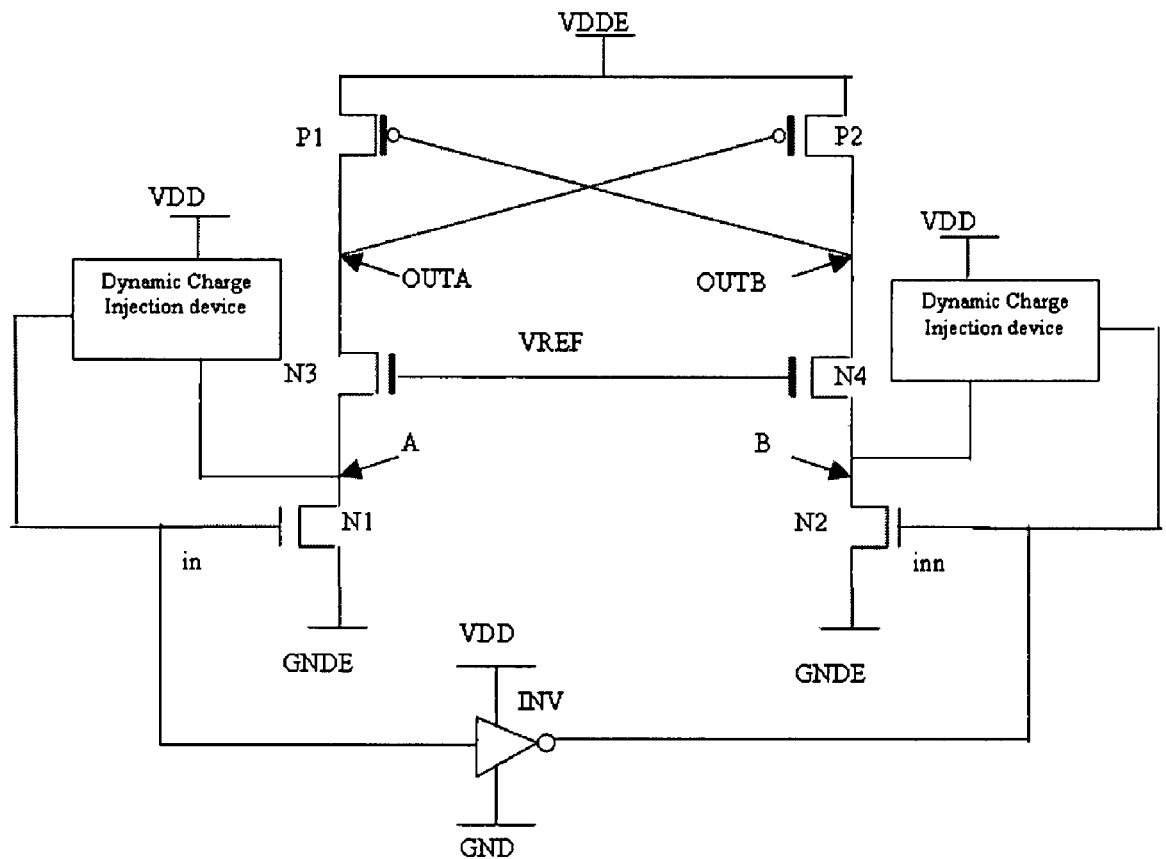
FIG. 6 illustrates a block diagram of an improvement of FIG. 2 operational at all supply ranges according to another embodiment of the present invention.

FIG. 6 illustrates a block level implementation of a new algorithm according to another embodiment of the present invention. A dynamic charge injection device is coupled to a lower supply level node VDD, an intermediate node A and an input signal in are added. Another dynamic charge injection device is connected in similar fashion to the opposite branch. Each dynamic charge injection device senses the input signal (in/inn) and sources current into the corresponding intermediate node (A/B) when the input signal (in/inn) switches from a high to a low logic level and is turned off thereafter. This not only nullifies the effect of capacitive coupling between the input node (in/inn) and the intermediate node (A/B), but also charges the intermediate node A/B to initiate early triggering of the regenerative feedback among cross coupled PMOS devices.

Figure 7:
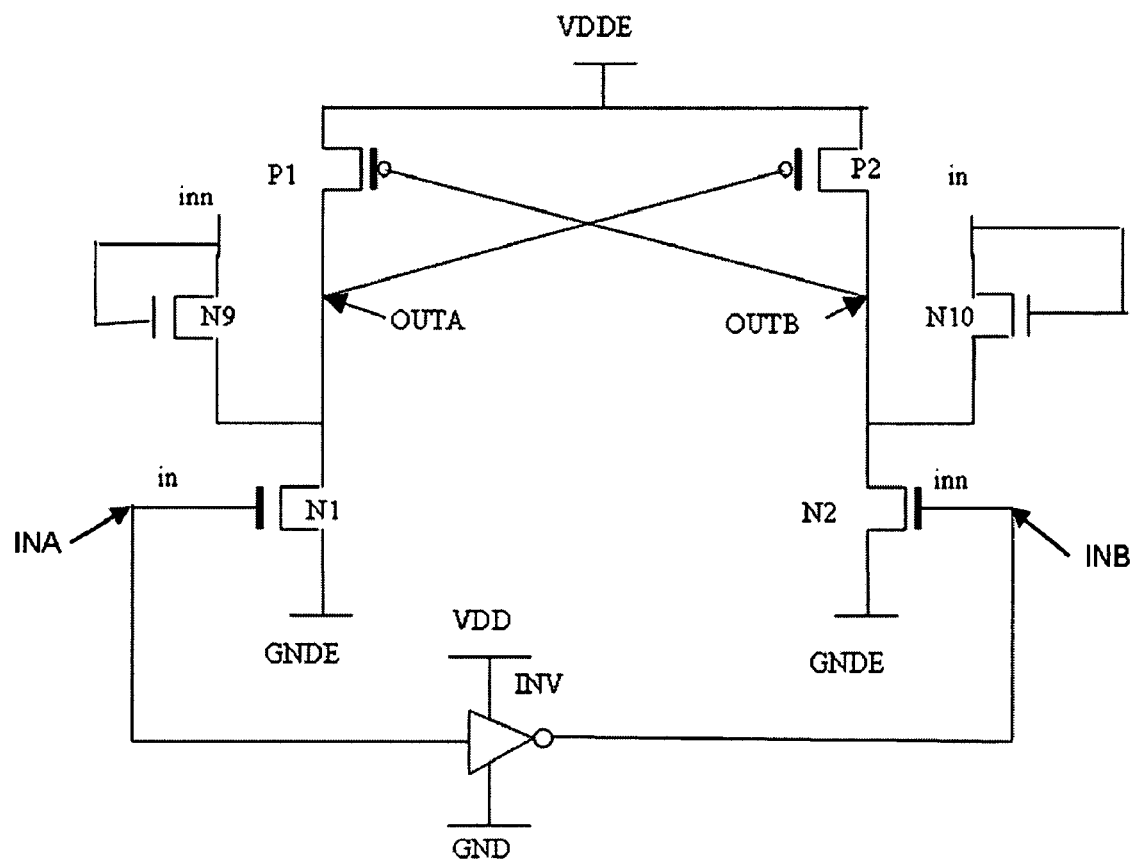
FIG. 7 illustrates a sample schematic implementation of the embodiment of FIG. 3.

FIG. 7 illustrates a circuit diagram of a high speed level shifter for a high frequency operation according to an embodiment of the present invention.

A high speed level shifter circuit for a high frequency operation includes a first PMOS transistor P1, a second PMOS transistor P2, a first NMOS transistor N1, a second NMOS transistor N2, an inverter circuit INV, a first NMOS diode N9 and a second NMOS diode N10.

The first PMOS transistor P1 has a source terminal connected to a high voltage supply VDDE, a drain terminal connected to a first output node OUTA, and a gate terminal connected to a second output node OUTB. The second PMOS transistor P2 has a source terminal connected to the high voltage supply VDDE, a drain terminal connected to the second output node OUTB and a gate terminal connected to the first output node OUTA. The first NMOS transistor N1 has a drain terminal connected to the drain terminal of the first PMOS transistor P1 through the first output node OUTA, a source terminal connected to a ground voltage GNDE and a gate terminal connected to a first input node INA for receiving a first input signal in. The second NMOS transistor N2 has a drain terminal connected to the drain terminal of the second PMOS transistor P2 through the second output node OUTB, a source terminal connected to the ground voltage GNDE and a gate terminal connected to a second input node INB for receiving a second input signal inn. The second signal inn is an inverted signal of the first input signal in. The inverter circuit INV is operatively coupled between the gate terminal of the first NMOS transistor N1 and the gate terminal of the second NMOS transistor N2 for inverting the first input signal in to the second input signal inn. A first NMOS diode N9 is connected to the first output node OUTA for providing the second input signal inn and a second NMOS diode N10 is connected to the second output node OUTB for providing the first input signal in.

The structure of FIG. 7 is useful when there is a small difference between low voltage supply VDD and the high voltage supply VDDE. This architecture is designed up-to VDDE=1.98V, but the idea is not limited to these supply levels only. In the light of the block level implementation illustrated in FIG. 3, a dynamic charge injection device has been implemented using thin gate oxide N-channel transistor (this N-channel transistor can also be a thick gate oxide transistor) in diode connected configuration. The transistor N9 is coupled between inn and OUTA. The transistor N10 is coupled between in and OUTB. When the input signal in switches from a high to low logic level, the inverted signal inn switches from the low to high logic level. Thus, the transistor N1 starts to turn off and the transistor N9 starts turning on. As a result, the transistor N9 sources current into the node OUTA and is turned off thereafter. This not only nullifies the effect of capacitive coupling between the input node INA and the output node OUTA, but also charges the output node OUTA to initiate early triggering of the regenerative feedback among cross coupled PMOS devices (P1, P2). The dynamic charge injection device connected to the output node OUTB is off since the transistor N10 is off. Similar operation can be explained when the input signal in switches from low to high logic level.

Figure 8:
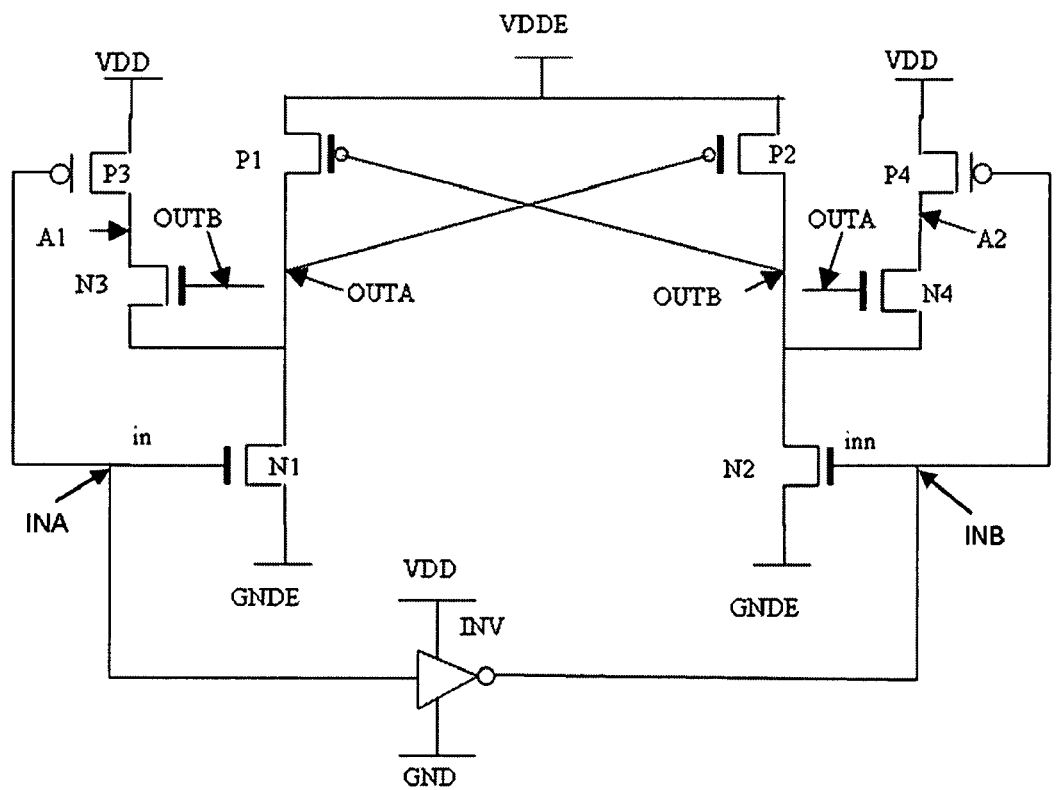
FIG. 8 illustrates a sample schematic implementation of the embodiment of FIG. 4.

FIG. 8 illustrates a circuit diagram of a high speed level shifter for high frequency operation according to another embodiment present invention.

A high speed level shifter circuit for a high frequency operation including a first PMOS transistor P1, a second PMOS transistor P2, a first NMOS transistor N1, a second NMOS transistor N2, an inverter circuit INV, a third NMOS transistor N3, a third PMOS transistor P3, a fourth NMOS transistor N4, a fourth PMOS transistor P4.

The first PMOS transistor P1 has a source terminal connected to a high voltage supply VDDE, a drain terminal connected to a first output node OUTA, and a gate terminal connected to a second output node OUTB. The second PMOS transistor P2 has a source terminal connected to the high voltage supply VDDE, a drain terminal connected to the second output node OUTB, and a gate terminal connected to the first output node OUTA. The first NMOS transistor N1 has a drain terminal connected to the drain terminal of the first PMOS transistor P1 through the first output node OUTA, a source terminal connected to a ground voltage GNDE and a gate terminal connected to a first input node INA for receiving a first input signal in. The second NMOS transistor N2 has a drain terminal connected to the drain terminal of the second PMOS transistor P2 through the second output node OUTB, a source terminal connected to the ground voltage GNDE and a gate terminal connected to a second input node INB for receiving a second input signal inn. The second signal inn is an inverted signal of the first input signal in. The inverter circuit INV operatively coupled between the gate terminal of the first NMOS transistor N1 and the gate terminal of the second NMOS transistor N2 for inverting the first input signal in to the second input signal inn. The third NMOS transistor N3 has a source terminal connected to the first output node OUTA, a drain terminal connected to a first node A1 and a gate terminal connected to the second output node OUTB. The third PMOS P3 transistor has a source terminal connected to a low voltage supply VDD, a drain terminal connected to the drain terminal of the third NMOS transistor N3 through the first node A1 and a gate terminal connected to the gate terminal of the first NMOS transistor N1 through the first input node INA. The fourth NMOS transistor N4 has a source terminal connected to the second output node OUTB, a drain terminal connected to a second node A2 and a gate terminal connected to the first output node OUTA. The fourth PMOS transistor P4 has a source terminal connected to the low voltage supply VDD, a drain terminal connected to the drain terminal of the fourth NMOS transistor N4 through the second node A2 and a gate terminal connected to the gate terminal of the second NMOS transistor N2 through the second input node INB.

The embodiment of FIG. 8 can be utilized when the high voltage supply VDDE goes up to 2.7V. In the light of the block level implementation illustrated in FIG. 4, the dynamic charge injection device has been implemented using a thin gate oxide P-channel transistor (this P-channel transistor can also be a thick gate oxide transistor) and a thick gate oxide N channel transistor. The P-Channel transistor P3 is coupled between the low voltage supply node VDD and the first node A1. The gate of transistor P3 is coupled to the input signal in. The N-Channel transistor N3 is coupled between the first node A1 and the first output node OUTA. The gate of the transistor N3 is coupled to opposite ladder second output node OUTB. Similarly, the P-Channel transistor P4 is coupled between the low voltage supply node VDD and the second node A2. The gate of transistor P4 is coupled to the input signal inn. The N-Channel transistor N4 is coupled between the intermediate node A2 and the output node OUTB. The gate of transistor N4 is coupled to the opposite ladder first output node OUTA. When the input signal in is high, the signal inn is low, the output node OUTA is low and the output node OUTB is high. As the input signal in switches from high to low logic level, the transistor P3 is turned on sourcing current from the low voltage supply VDD into the node A1. Since the transistor N3 is on, it will start charging the node OUTA to trigger the regenerative feedback of cross coupled transistors (P1, P2). As feedback picks up, the node OUTB begins to fall, thereby turning off the transistor N3 and hence the dynamic charge injection device. The dynamic charge injection device connected to the output node OUTB does not play any role as the transistor P4 is turned off when the signal inn switches from low to high logic level. Similar operation can be explained when the input signal in goes from low to high logic level. One skilled in the art can easily understand that this embodiment should be used for the high voltage supply VDDE up to 2.7 V only, as for the higher VDDE levels, the dynamic charge injection device can source current into the low voltage supply VDD during transition period.

Figure 9:
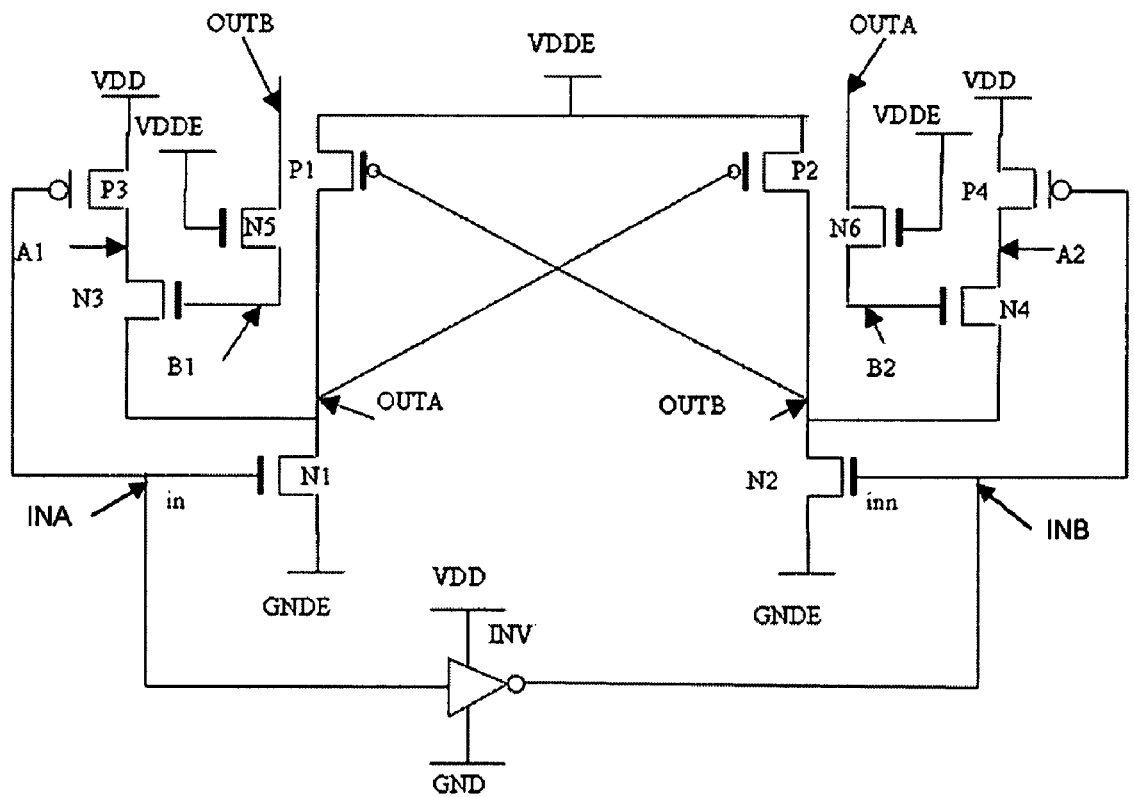
FIG. 9 illustrates a sample schematic implementation of the embodiment of FIG. 5

FIG. 9 illustrates a circuit diagram of a high speed level shifter for a high frequency operation according to further embodiment present invention.

A high speed level shifter circuit for a high frequency operation includes a first PMOS transistor P1, a second PMOS transistor P2, a first NMOS transistor N1, a second NMOS transistor N2, an inverter circuit INV, a third NMOS transistor N3, a third PMOS transistor P3, a fourth NMOS transistor N4, a fourth PMOS transistor P4, a fifth NMOS N5 transistor and a sixth NMOS transistor N6.

The first PMOS transistor P1 has a source terminal connected to a high voltage supply VDDE, a drain terminal connected to a first output node OUTA, and a gate terminal connected to a second output node OUTB. The second PMOS transistor P2 has a source terminal connected to the high voltage supply VDDE, a drain terminal connected to the second output node OUTB, and a gate terminal connected to the first output node OUTA. The first NMOS transistor N1 has a drain terminal connected to the drain terminal of the first PMOS transistor P1 through the first output node OUTA, a source terminal connected to a ground voltage GNDE and a gate terminal connected to a first input node INA for receiving a first input signal in. The second NMOS transistor N2 has a drain terminal connected to the drain terminal of the second PMOS transistor P2 through the second output node OUTB, a source terminal connected to the ground voltage GNDE and a gate terminal connected to a second input node INB for receiving a second input signal inn. The second signal inn is an inverted signal of the first input signal in. The inverter circuit INV is operatively coupled between the gate terminal of the first NMOS transistor N1 and the gate terminal of the second NMOS transistor N2 for inverting the first input signal in to the second input signal inn. The third NMOS transistor N3 has a source terminal connected to the first output node OUTA, a drain terminal connected to a first node A1 and a gate terminal connected to a third node B1. The third PMOS transistor P3 has a source terminal connected to a low voltage supply VDD, a drain terminal connected to the drain terminal of the third NMOS transistor N3 through the first node A1 and a gate terminal connected to the gate terminal of the first NMOS transistor N1 through the first input node INA. The fifth NMOS transistor N5 has a drain terminal connected to the second output node OUTB, a source terminal connected to the gate terminal of the third NMOS transistor N3 through the third node B1 and a gate terminal connected to the high voltage supply VDDE. The fourth NMOS transistor N4 has a source terminal connected to the second output node OUTB, a drain terminal connected to a second node A2 and a gate terminal connected to a fourth node B2. The fourth PMOS transistor P4 has a source terminal connected to the low voltage supply VDD, a drain terminal connected to the drain terminal of the fourth NMOS transistor N4 through the second node A2 and a gate terminal connected to the gate terminal of the second NMOS transistor N2 through the second input node INB. The sixth NMOS transistor N6 has a drain terminal connected to the first output node OUTA, a source terminal connected to the gate terminal of the fourth NMOS transistor N4 through the fourth node B2 and a gate terminal connected to the high voltage supply VDDE.

FIG. 9 illustrates an improvement over prior art FIG. 1 when the high voltage supply VDDE goes up to 3.6V. In the light of the block level implementation illustrated in FIG. 5, the dynamic charge injection device has been implemented using a thin gate oxide P-channel transistor (this P-channel transistor can also be a thick gate oxide transistor) and two thick gate oxide N channel transistors. The P-Channel transistor P3 is coupled between lower voltage supply node VDD and first node A1. The gate of transistor P3 is coupled to the input signal in. The N-Channel transistor N3 is coupled between the first node A1 and first output node OUTA. The gate of transistor N3 is coupled to the third node B1. The N-Channel transistor N5 is coupled between the third node B1 and the opposite ladder second output node OUTB. The gate of transistor N5 is coupled to high voltage supply node VDDE. Similarly, the P-Channel transistor P4 is coupled between the low voltage supply node VDD and the second node A2. The gate of transistor P4 is coupled to the input signal inn. The N-Channel transistor N4 is coupled between the second node A2 and the second output node OUTB. The gate of transistor N4 is coupled to the fourth node B2. The N-Channel transistor N6 is coupled between the fourth node B2 and the opposite ladder first output node OUTA. The gate of transistor N6 is coupled to the high voltage supply node VDDE. When the input signal in is high, the signal inn is low, the output node OUTA is low and the output node OUTB is high. Since the OUTB is at a high logic level and the transistor N5 acts as a pass gate and the node B1 is charged up-to the VDDE minus threshold voltage of the transistor N5. As the input signal in switches from high to low logic level, the transistor P3 is turned on sourcing current from the low voltage supply VDD into the node A1. Since the transistor N3 is on, it will start charging the node OUTA to trigger the regenerative feedback of cross coupled transistors (P1, P2). As feedback picks up, the node OUTB begins to fall, thereby discharging the node B1 and hence turning off the transistor N3. This turns off the dynamic charge injection device connected to the output node OUTA. The dynamic charge injection device connected to the output node OUTB does not play any role as the transistor P4 is turned off, when the signal inn switches from low to high logic level. Similar operation can be explained when the input signal in goes from low to high logic level. One skilled in the art can easily understand that this embodiment should be used for the high voltage supply VDDE up to 3.6 V only, as for higher the VDDE levels, the dynamic charge injection device can source current into the low voltage supply VDD during transition period.

Figure 10:
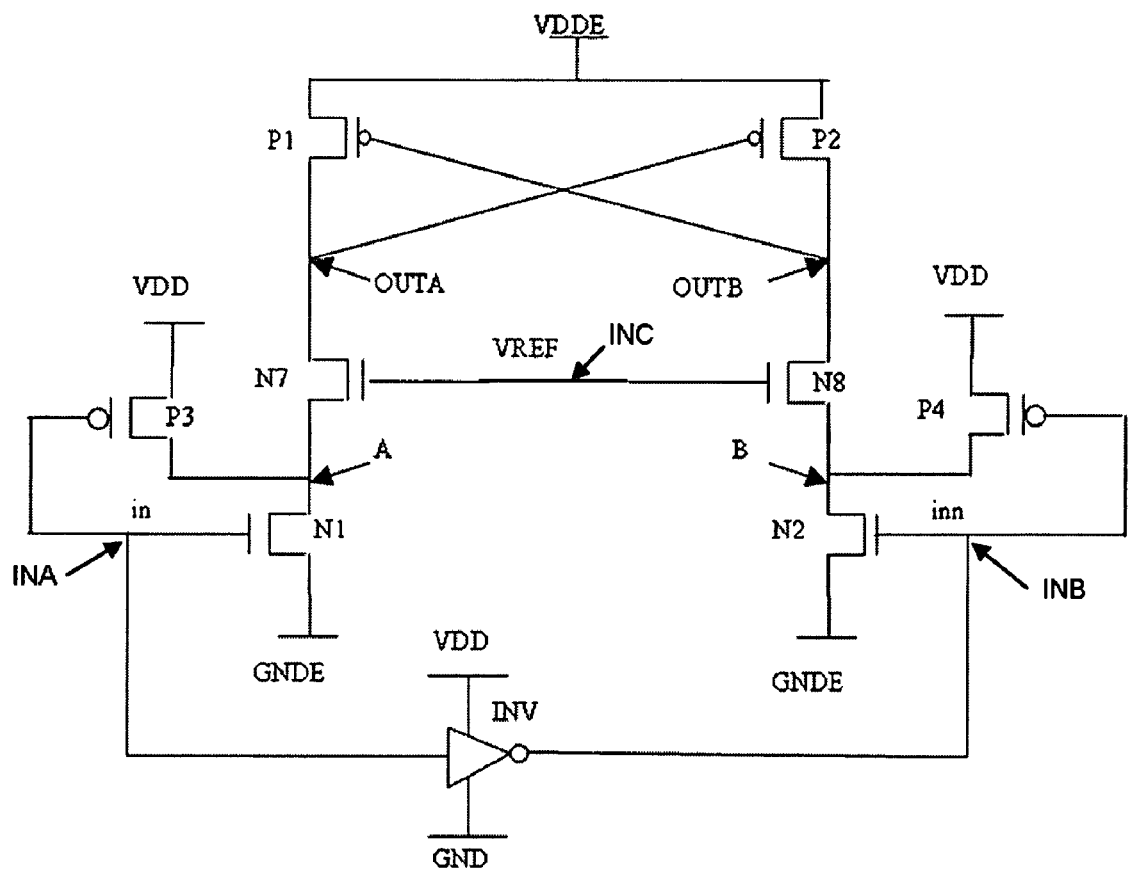
FIG. 10 illustrates a sample schematic implementation of the embodiment of FIG. 6.

FIG. 10 illustrates a circuit diagram of a high speed level shifter for high frequency operation according to yet another embodiment present invention.

A high speed level shifter circuit for a high frequency operation includes a first PMOS transistor P1, a second PMOS transistor P2, a first NMOS transistor N1, a second NMOS transistor N2, an inverter circuit INV, a third NMOS transistor N7, a fourth NMOS transistor N8, a third PMOS transistor P3, and a fourth third PMOS transistor P4.

The first PMOS transistor P1 has a source terminal connected to a high voltage supply VDDE, a drain terminal connected to a first output node OUTA, and a gate terminal connected to a second output node OUTB. The second PMOS transistor P2 has a source terminal connected to the high voltage supply VDDE, a drain terminal connected to the second output node OUTB, and a gate terminal connected to the first output node OUTA. The first NMOS transistor N1 having a drain terminal connected to the first node A, a source terminal connected to a ground voltage GNDE and a gate terminal connected to a first input node INA for receiving a first input signal in. The second NMOS transistor N2 has a drain terminal connected to the second node B, a source terminal connected to the ground voltage GNDE and a gate terminal connected to a second input node INB for receiving a second input signal inn. The third NMOS transistor N7 has a drain terminal connected to the drain terminal of the first PMOS transistor P1 through the first output node OUTA, a source terminal connected to the drain terminal of the first NMOS transistor N1 through the first node A and a gate terminal connected to a third node INC for receiving a reference signal VREF. The fourth NMOS transistor N8 has a drain terminal connected to the drain terminal of the second PMOS transistor P2 through the second output node OUTB, a source terminal connected to the drain terminal of the second NMOS transistor N2 through the second node B and a gate terminal connected to the gate terminal of the third NMOS transistor N7 through the third node INC for receiving a reference signal VREF. The inverter circuit INV is operatively coupled between the gate terminal of the first NMOS transistor N1 and the gate terminal of the second NMOS transistor N2 for inverting the first input signal in to the second input signal inn. The third PMOS transistor P3 has a source terminal connected to a low voltage supply VDD, a drain terminal connected to the first node A and a gate terminal connected to the gate terminal of the first NMOS transistor N1 through the first input node INA. The fourth PMOS transistor P4 has a source terminal connected to the low voltage supply VDD, a drain terminal connected to the second node B and a gate terminal connected to the gate terminal of the second NMOS transistor N2 through the second input node INB.

The structure of FIG. 10 can be used over any high voltage supply range. In the light of the block level implementation illustrated in FIG. 6, the dynamic charge injection device has been implemented using thin gate oxide P-channel transistor (this P-channel transistor can also be a thick gate oxide transistor). The P-channel transistor P3 is coupled between the low voltage supply VDD and the first node A. The P-channel transistor P4 is coupled between the low voltage supply VDD and the second node B. When the input signal in switches from a high to a low logic level, the inverted signal inn switches from a low to a high logic level. Thus the transistor N1 starts turning off and the transistor P3 starts turning on. As a result, the transistor P3 sources current into the node A, which eventually charges the output node OUTA through transistor N7. The initial charging of the first output node OUTA initiates early triggering of the regenerative feedback among cross coupled PMOS devices (P1, P2). The dynamic charge injection device connected to the output node OUTB is turned off when the signal inn switches from low to high logic level. Similar operation can be explained when the input signal in switches from low to high logic level.

The above embodiments lead to fast rise/fall transitions at the output nodes and allow the circuit to function at higher frequencies with improved performance.

Embodiments of the present invention are high speed level shifter circuits offering many advantages. Firstly, the present high speed level shifter provides fast rise/fall transitions at the output nodes and allows the circuit to function at higher frequencies with improved performance. Secondly, the level shifter operates at higher frequencies and consumes a lower crowbar current.

Although the disclosure of the above systems and methods has been described in connection with embodiments of the present invention illustrated in the accompanying drawings, it is not limited thereto. It will be apparent to those skilled in the art that various substitutions, modifications and changes may be made thereto without departing from the scope and spirit of the disclosure.

We claim:

1. A level shifter circuit comprising MOS input devices and cross-coupled MOS pull-up devices, each MOS pull-up device being coupled in series with a respective one of the MOS input devices, and each of the MOS input devices including an input node adapted to receive an input signal and including a signal node coupled to a corresponding output node of the level shifter circuit, the level shifter circuit further comprising a dynamic charge injection device coupled to each output node, each dynamic charge injection device operable responsive to the input signal applied to a corresponding one of the MOS input devices to inject current into the corresponding output node to reduce a capacitive coupling between the input node and the corresponding output node;

wherein the level shifter circuit comprises:
a first PMOS transistor having a source terminal connected to a high voltage supply, a drain terminal connected to a first output node, and a gate terminal connected to a second output node;
a second PMOS transistor having a source connected to the high voltage supply, a drain terminal connected to the second output node, and a gate terminal connected to the first output node;
a first NMOS transistor having a drain terminal connected to the drain terminal of the first PMOS transistor through the first output node, a source terminal connected to a ground voltage and a gate terminal connected to a first input node for receiving a first input signal;
a second NMOS transistor having a drain terminal connected to the drain terminal of the second PMOS transistor through the second output node, a source terminal connected to the ground voltage and a gate terminal connected to a second input node for receiving a second input signal, the second signal being an inverted signal of the first input signal;
an inverter circuit operatively coupled between the gate terminal of first NMOS transistor and the gate terminal of the second NMOS transistor for inverting the first input signal to the second input signal;
a first NMOS diode connected to the first output node for providing the second input signal; and
a second NMOS diode connected to the second output node for providing the first input signal.

2. A level shifter circuit comprising MOS input devices and cross-coupled MOS pull-up devices, each MOS pull-up device being coupled in series with a respective one of the MOS input devices, and each of the MOS input devices including an input node adapted to receive an input signal and including a signal node coupled to a corresponding output node of the level shifter circuit, the level shifter circuit further comprising a dynamic charge injection device coupled to each output node, each dynamic charge injection device operable responsive to the input signal applied to a corresponding one of the MOS input devices to inject current into the corresponding output node to reduce a capacitive coupling between the input node and the corresponding output node;

wherein the level shifter circuit comprises:
a first PMOS transistor having a source terminal connected to a high voltage supply, a drain terminal connected to a first output node, and a gate terminal connected to a second output node;
a second PMOS transistor having a source terminal connected to the high voltage supply, a drain terminal connected to the second output node, and a gate terminal connected to the first output node;
a first NMOS transistor having a drain terminal connected to the drain terminal of the first PMOS transistor through the first output node, a source terminal connected to a ground voltage and a gate terminal connected to a first input node for receiving a first input signal;
a second NMOS transistor having a drain terminal connected to the drain terminal of the second PMOS transistor through the second output node, a source terminal connected to the ground voltage and a gate terminal connected to a second input node for receiving a second input signal, the second signal being an inverted signal of the first input signal;
an inverter circuit operatively coupled between the gate terminal of first NMOS transistor and the gate terminal of the second NMOS transistor for inverting the first input signal to the second input signal;
a third NMOS transistor having a source terminal connected to the first output node, a drain terminal connected to a first node and a gate terminal connected to the second output node;
a third PMOS transistor having a source terminal connected to a low voltage supply, a drain terminal connected to the drain terminal of the third NMOS transistor through the first node and a gate terminal connected to the gate terminal of the first NMOS transistor through the first input node;
a fourth NMOS transistor having a source terminal connected to the second output node, a drain terminal connected to a second node and a gate terminal connected to the first output node; and
a fourth PMOS transistor having a source terminal connected to the low voltage supply, a drain terminal connected to the drain terminal of the fourth NMOS transistor through the second node and a gate terminal connected to the gate terminal of the second NMOS transistor through the second input node.

3. A level shifter circuit comprising MOS input devices and cross-coupled MOS pull-up devices, each MOS pull-up device being coupled in series with a respective one of the MOS input devices, and each of the MOS input devices including an input node adapted to receive an input signal and including a signal node coupled to a corresponding output node of the level shifter circuit, the level shifter circuit further comprising a dynamic charge injection device coupled to each output node, each dynamic charge injection device operable responsive to the input signal applied to a corresponding one of the MOS input devices to inject current into the corresponding output node to reduce a capacitive coupling between the input node and the corresponding output node;

wherein the level shifter circuit comprises:
 a first PMOS transistor having a source terminal connected to a high voltage supply, a drain terminal connected to a first output node, and a gate terminal connected to a second output node;
 a second PMOS transistor having a source connected to the high voltage supply, a drain connected to the second output node, and a gate terminal connected to the first output node;
 a first NMOS transistor having a drain terminal connected to the drain terminal of the first PMOS transistor through the first output node, a source terminal connected to a ground voltage and a gate terminal connected to a first input node for receiving a first input signal;
 a second NMOS transistor having a drain terminal connected to the drain terminal of the second PMOS transistor through the second output node, a source terminal connected to the ground voltage and a gate terminal connected to a second input node for receiving a second input signal, the second signal being an inverted signal of the first input signal;
 an inverter circuit operatively coupled between the gate terminal of first NMOS transistor and the gate terminal of the second NMOS transistor for inverting the first input signal to the second input signal;
 a third NMOS transistor having a source terminal connected to the first output node, a drain terminal connected to a first node and a gate terminal connected to a third node;
 a third PMOS transistor having a source terminal connected to a low voltage supply, a drain terminal connected to the drain terminal of the third NMOS transistor through the first node and a gate terminal connected to the gate terminal of the first NMOS transistor through the first input node;
 a fourth NMOS transistor having a source terminal connected to the second output node, a drain terminal connected to a second node and a gate terminal connected to a fourth node;
 a fourth PMOS transistor having a source terminal connected to the low voltage supply, a drain terminal connected to the drain terminal of the fourth NMOS transistor through the second node and a gate terminal connected to the gate terminal of the second NMOS transistor through the second input node;
 a fifth NMOS transistor having a drain terminal connected the second output node, a source terminal connected to the gate terminal of the third NMOS transistor through the third node and a gate terminal connected to the high voltage supply; and
 a sixth NMOS transistor having a drain terminal connected the first output node, a source terminal connected to the gate terminal of the fourth NMOS transistor through the fourth node and a gate terminal connected to the high voltage supply.

4. A level shifter circuit comprising MOS input devices and cross-coupled MOS pull-up devices, each MOS pull-up device being coupled in series with a respective one of the MOS input devices, and each of the MOS input devices including an input node adapted to receive an input signal and including a signal node coupled to a corresponding output node of the level shifter circuit, the level shifter circuit further comprising a dynamic charge injection device coupled to each output node, each dynamic charge injection device operable responsive to the input signal applied to a corresponding one of the MOS input devices to reduce a capacitive coupling between the input node and the corresponding output node;

wherein each dynamic charge injection device is adapted to receive a low supply voltage, the input signal applied to the MOS input device coupled to the corresponding output node, and a signal developed on another one of the output nodes, and wherein the dynamic charge injection device is operable responsive to the corresponding input signal and signal on the other output node to supply charge from the low supply voltage to the corresponding output node; and wherein each dynamic charge injection device comprises a PMOS transistor coupled in series with an NMOS transistor between the low supply voltage and the corresponding output node, and wherein a gate of the PMOS transistor is coupled to receive the input signal and a gate of the NMOS transistor is coupled to the other output node.

5. A level shifter circuit comprising MOS input devices and cross-coupled MOS pull-up devices, each MOS pull-up device being coupled in series with a respective one of the MOS input devices, and each of the MOS input devices including an input node adapted to receive an input signal and including a signal node coupled to a corresponding output node of the level shifter circuit, the level shifter circuit further comprising a dynamic charge injection device coupled to each output node, each dynamic charge injection device operable responsive to the input signal applied to a corresponding one of the MOS input devices to reduce a capacitive coupling between the input node and the corresponding output node;

wherein each dynamic charge injection device is adapted to receive a low supply voltage, a high supply voltage, the input signal applied to the MOS input device coupled to the corresponding output node, and a signal developed on another one of the output nodes, and wherein the dynamic charge injection device is operable responsive to the corresponding input signal, signal on the other output node and high supply voltage to supply charge from the low supply voltage to the corresponding output node; and wherein each dynamic charge injection device comprises a PMOS transistor coupled in series with a first NMOS transistor between the low supply voltage and the corresponding output node, and wherein a gate of the PMOS transistor is coupled to receive the input signal and a gate of the first NMOS transistor receives the signal from the other output node through a second NMOS transistor adapted to receive the high supply voltage on a gate of the second NMOS transistor.

* * * * *

UNITED STATES PATENT AND TRADEMARK OFFICE
CERTIFICATE OF CORRECTION

| | |
|---|---|
| PATENT NO. | : 7,609,090 B2 |
| APPLICATION NO. | : 11/895643 |
| DATED | : October 27, 2009 |
| INVENTOR(S) | : Ankit Srivasatava and Sourav Jandial |

Page 1 of 1

It is certified that error appears in the above-identified patent and that said Letters Patent is hereby corrected as shown below:

- In Claim 3, Column 15, Line 63 of the patent, please insert the text -- to -- after the text "drain terminal connected" and before the text "the second output node".

- In Claim 3, Column 16, Line 4 of the patent, please insert the text -- to -- after the text "drain terminal connected" and before the text "the first output node".

Signed and Sealed this

Sixteenth Day of February, 2010

David J. Kappos
*Director of the United States Patent and Trademark Office*